United States Patent
Varghese

(10) Patent No.: US 10,587,210 B2
(45) Date of Patent: Mar. 10, 2020

(54) ENERGY SENSING AND HARVESTING CANTILEVER

(71) Applicant: Ron Varghese, Palm Harbor, FL (US)

(72) Inventor: Ron Varghese, Palm Harbor, FL (US)

(*) Notice: Subject to any disclaimer, the term of this patent is extended or adjusted under 35 U.S.C. 154(b) by 542 days.

(21) Appl. No.: 15/456,885

(22) Filed: Mar. 13, 2017

(65) Prior Publication Data

US 2017/0264215 A1    Sep. 14, 2017

Related U.S. Application Data

(60) Provisional application No. 62/307,618, filed on Mar. 14, 2016.

(51) Int. Cl.
| | | |
|---|---|---|
| *H01L 41/047* | (2006.01) | |
| *H02N 2/18* | (2006.01) | |
| *H01L 41/113* | (2006.01) | |

(52) U.S. Cl.
CPC ........... *H02N 2/188* (2013.01); *H01L 41/047* (2013.01); *H01L 41/1136* (2013.01)

(58) Field of Classification Search
CPC .............................. H01L 41/047; H02N 2/188
USPC ................. 310/339, 365, 367, 369
See application file for complete search history.

(56) References Cited

U.S. PATENT DOCUMENTS

| | | | | |
|---|---|---|---|---|
| 7,161,279 B2* | 1/2007 | Topliss | .................. | H01L 41/092 |
| | | | | 310/330 |
| 7,948,153 B1* | 5/2011 | Kellogg | .............. | H01L 41/1136 |
| | | | | 310/329 |
| 2010/0084947 A1* | 4/2010 | Yoon | .................... | H01L 41/1136 |
| | | | | 310/339 |
| 2011/0018397 A1* | 1/2011 | Fujimoto | .............. | H01L 41/113 |
| | | | | 310/339 |
| 2013/0140950 A1* | 6/2013 | Fuentes-Fernandez | ...................... | |
| | | | | H02N 2/186 |
| | | | | 310/319 |
| 2013/0207520 A1* | 8/2013 | Near | .................... | H01L 41/1134 |
| | | | | 310/339 |
| 2016/0156287 A1* | 6/2016 | Yang | ................... | H01L 41/1136 |
| | | | | 310/339 |

FOREIGN PATENT DOCUMENTS

| | | | | | |
|---|---|---|---|---|---|
| CN | 103746602 | * | 4/2014 | ............... | H02N 2/18 |
| DE | 102004056754 A1 | * | 1/2006 | ............... | H02N 2/18 |

* cited by examiner

*Primary Examiner* — Thomas M Dougherty
(74) *Attorney, Agent, or Firm* — Larson & Larson, P.A.; Justin P. Miller; Frank Liebenow

(57) ABSTRACT

An energy harvesting cantilever formed from multiple curved sections, with each curved section wrapped within the prior curved section but in an opposing direction, is the proposed solution to the problems described above. Such an energy harvesting cantilever favors bending over torsion, can be manufactured at a small scale, and will generate useful electrical energy with low frequency inputs.

19 Claims, 10 Drawing Sheets

ENERGY SENSING AND HARVESTING CANTILEVER

CROSS-REFERENCE TO RELATED APPLICATION

This application is a non-provisional application related to U.S. patent application Ser. No. 62/307,618, filed Mar. 14, 2016, the disclosure of which is hereby incorporated by reference.

FIELD

This invention relates to the field of energy harvesters and sensors, in particular a micro-scale vibration-based energy harvester.

BACKGROUND

Energy comes in many forms. Some forms are more obvious than others, such as the thermal energy of hot coffee, or the electrical energy that runs our homes and offices.

Less obvious as a form of energy is vibration, which is a form of mechanical energy. Vibration comes in the form of sound, the shaking of machinery, or the invisible radio frequencies around us.

Sources of energy, among others, include the following:
Vibration of equipment or the motion of a human;
Oscillation of a magnetic field; and
Cyclical motions present in nature.

The energy from these sources can be made more useful, or measurable, by converting the mechanical vibrational energy into electrical energy. Such a conversion between types of energy is performed by an energy harvester. The harvester can also be considered a sensor, as it can sense mechanical energy and relay the energy as a proportional electrical output. The harvester can also be a type of transducer as it converts one form of energy into another.

The harvester can also be operated in reverse—electrical energy applied to the same device creates mechanical motion, and thereby making the same device an actuator too. Henceforth, for simplicity and clarity, energy harvester will be synonymous with "sensor" or "transducer."

Existing energy harvesters are unable to harvest low-frequency vibrations without the use of a tip mass, or without sacrificing compactness.

What is needed is a micro-scale energy harvester that can harvest low-frequency vibrations, while maintaining a small form factor.

SUMMARY

A sensing or energy harvesting cantilever formed from multiple curved sections, with each curved section wrapped within the prior curved section but in an opposing direction, is the proposed solution to the problems described above. Such an energy harvesting cantilever favors bending over torsion, can be manufactured at a small scale, and will generate useful electrical energy under low frequency inputs.

A sensor or energy harvester, as described below, operates best at a particular frequency. The closer the vibration is to the ideal, or natural, frequency of the harvester, the more efficient the energy generation. Most naturally-occurring sources of vibration have a low frequency, defined herein as at or less than 100 Hz, where Hz is hertz, or one cycle per second.

The energy harvesters disclosed herein are referred to as micro-scale harvesters due to their small size of no greater than a cube <1 mm, with the cantilever of the harvester in the range of tens to hundreds of microns, or less, in width. The disclosed harvester can be scaled down to the micron and nanometer scales.

Historically, such small-scale energy harvesting devices have been inductive or electromagnetic in design. But such designs cannot be produced at scales below 5 mm because of limitations in the ability to miniaturize the magnets and electrical coils used for construction.

To overcome the scale restrictions of inductive and electromagnetic designs, piezoelectric is the preferred construction. The piezoelectric device is comprised of piezoelectric materials sandwiched between metallic electrodes constructed of, for example, platinum.

The drawback of cantilevered vibrational devices is that as size is decreased, frequency increases, and the resulting device is no longer a low-frequency harvester. The addition of a tip mass reduces the frequency, but limits the range of acceleration. The result is a decrease in the amount of force that the cantilever can withstand before stress causes breakage.

As an additional drawback, shrinking the harvester size limits the maximum power conversion due to the reduced size of the cantilever on which resides the piezoelectric element. Increasing the area of the piezoelectric element is a means by which the energy conversion can be increased.

The preferred solution to both the problem of high frequency and low piezoelectric area is to increase the beam length of the cantilever. But increases in beam length result in increases to overall size of the energy harvester.

The fundamental frequency of a simple cantilever beam is calculated as $$\frac{1}{2\pi}\sqrt{k/m}$$

where k is the stiffness, proportional to width*

$$\text{width} * \frac{\text{thickness}^3}{\text{length}^3},$$

and m is the mass, proportional to width*thickness*length. When the dimensions are reduced to micron-scale dimensions, the natural frequency of a simple cantilever increases to frequencies greater than larger cantilevers. The result is difficultly achieving low natural frequencies using micron-scale harvesters.

As discussed above, the drawback of a straight beam is the size of the resulting structure. Thus, curving the beam is a potential solution to fitting a longer beam in a smaller area.

By curving the beam, a longer length of cantilever can be fit into a smaller space. Such curved structures include spiral cantilever beams. But a pure spiral shape causes excessive torsion, or twisting, over its length, has high displacement and bending at rest (leading to a structure that protrudes out of plane of the device) and is thus highly susceptible to breakage. Spiral harvesters generate less voltage after a certain number of spiral turns due to voltage cancelation from torsion.

A superior solution to a pure spiral shape is a circular pattern where the beam wraps back on itself, switching from a clockwise path to a counter-clockwise path. This shape creates deflection that favors bending over torsion, thereby increasing the efficiency of the resulting device.

Data collected during testing supports the theory, showing that the circular zigzag pattern can produce resonance frequencies consistent with other shapes, but with superior voltage generation characteristics.

Table 1 below shows harvester shapes with modeled and actual resonance frequencies.

TABLE 1

Deep RIE (Reactive Ion Etch) Silicon only MEMS structures

| Harvester shape | | Resonance (kHz) | |
|---|---|---|---|
| | | Model | Actual |
| 4 turn Circular Spiral | | 6.065 | 6.71 |
| 3 turn Circular Spiral | | 12.637 | 13.413 |
| 3 turn Circular Zigzag | | 12.938 | 13.406 |
| 2 turn Circular Zigzag | | 34.07 | 38.688 |
| 3 arc Circular cantilever | long arc | 20.644 | 20.787 |
| | middle arc | 44.747 | 45.063 |
| | short arc | 76.514 | 77.37 |
| 2.5 turn Square Spiral | | 16.825 | 15.45 |
| 2 turn Square Spiral | | 40.345 | 36.19 |
| 3 beam Linear Zigzag | | 28.883 | 33.13 |
| 5 beam Linear Zigzag | | 13.464 | 13.55 |

Table 2 shows frequency, voltage, and power measurements for 4 and 5 turn circular zigzag shaped cantilevers. The shapes were constructed from single-layer piezoelectric sheets; unimorph construction, which is one active layer and one inactive layer; and bimorph construction, which is two active layers. An active layer is a piezoelectric layer, whereas an inactive layer, or passive layer, is a material that does not generate electricity, such as silicon.

TABLE 2 d31 mode Microwater jet Piezos

| | Sheet | Unimorph | Bimorph |
|---|---|---|---|
| Frequency (Hz) +/− 3 dB | | | |
| 4 turn Circular Zigzag | 52.71 +/− 1 | 64.0 +/− 2.5 | 89.3 +/− 5.7 |
| 5 turn Circular Zigzag | 43.25 +/− 0.5 | 37.75 +/− 4.25 | 67.74 +/− 4.97 |
| Voltage (Voc, V) | | | |
| 4 turn Circular Zigzag | 0.138 | 0.567 | 1.842 |
| 5 turn Circular Zigzag | 0.196 | 0.639 | 1.294 |
| Power (µW) | | | |
| 4 turn Circular Zigzag | 1.02 | 5.466 | 52.89 |
| 5 turn Circular Zigzag | 1.288 | 7.232 | 18.88 |

TABLE 3 d33 mode Piezo MEMS with Chevron electrodes

| | Silicon |
|---|---|
| Frequency (Hz) | |
| 4 turn Circular Zigzag | 31.47 |
| 5 turn Circular Zigzag | 28.66 |
| Voltage (Voc, V) | |

TABLE 3-continued d33 mode Piezo MEMS with Chevron electrodes

| | Silicon |
|---|---|
| 4 turn Circular Zigzag | 0.68 |
| 5 turn Circular Zigzag | 1.06 |
| Power (µW) | |
| 4 turn Circular Zigzag | 4.15 |
| 5 turn Circular Zigzag | 13.15 |

With this background, the energy sensing and harvesting cantilever will be described in detail.

BRIEF DESCRIPTION OF THE DRAWINGS

The invention can be best understood by those having ordinary skill in the art by reference to the following detailed description when considered in conjunction with the accompanying drawings in which.

DETAILED DESCRIPTION

Figure 1:
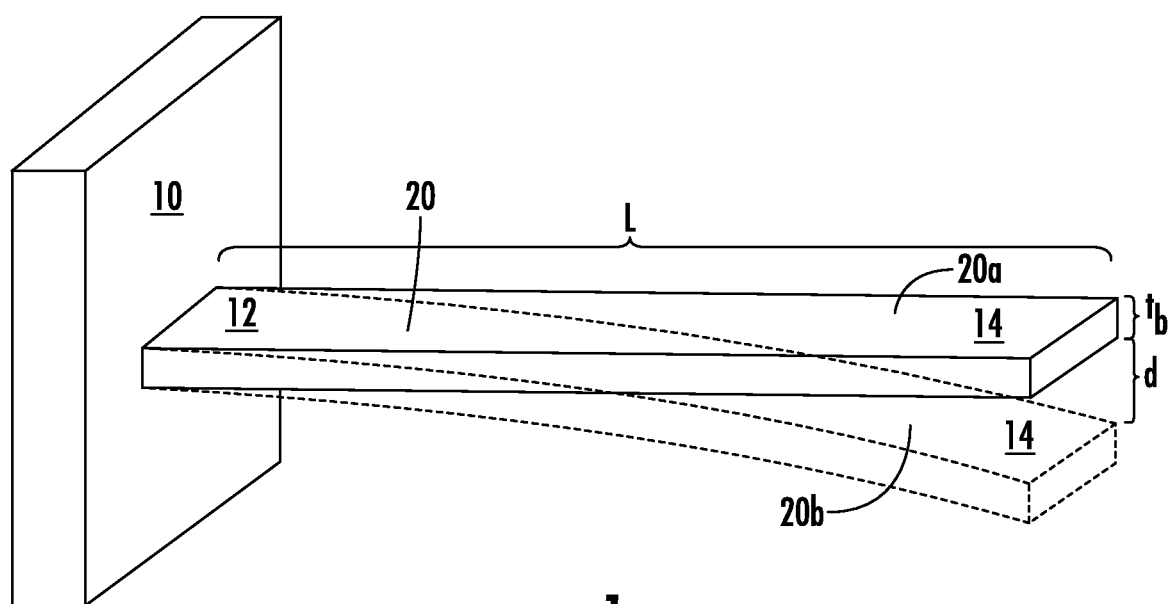
FIG. 1 illustrates a schematic view of a straight beam.

Reference will now be made in detail to the presently preferred embodiments of the invention, examples of which are illustrated in the accompanying drawings. Throughout the following detailed description, the same reference numerals refer to the same elements in all figures.

Referring to FIG. 1, a schematic view of a straight beam is shown.

For a better understanding of the benefits of the disclosed invention, a discussion of a typical beam is helpful. Beam 20, has a fixed end 12 affixed at anchor 10. The free end 14 is free to deflect in response to vibration.

Beam at rest 20a shows the beam 20 location under no load, and beam deflected 20b shows the beam 20 in a deflected position in response to a load. Beam length L is the total distance from the anchor 10 to the tip of the free end 14. Deflection distance d is a measurement of the amount of free end 14 deflection, and $t_b$ is a measurement of the thickness of beam 20. The combination of L, $t_b$, and d affect the quantity of energy generated by the deflection. An increase in any of these three variables results in an increase of generated energy.

Figure 2:
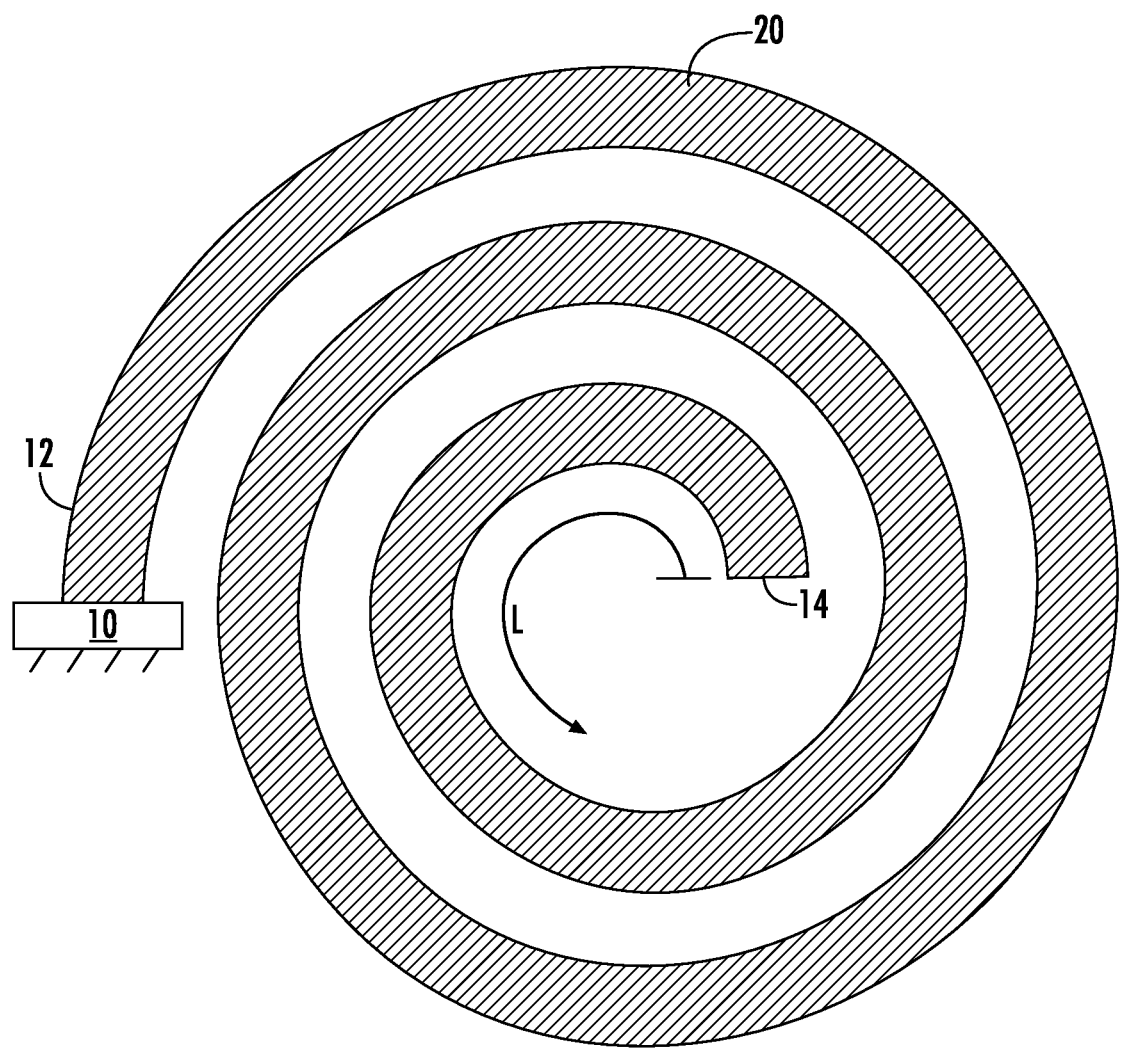
FIG. 2 illustrates a schematic view of a curved beam.

Referring to FIG. 2, a schematic view of a curved beam is shown.

Again shown are anchor 10, fixed end 12, and free end 14. By virtue of its shape, the curved beam 20 can fit a greater length L into a smaller space.

But with the shape of a single, continuous curve, the curved beam 10 creates a new problem of excessive torsion, or twisting. A load applied to the beam 20, even the load of only the beam's weight, results in a continuous increase in torsion, or twisting, along the entire length of the beam 20. The piezoelectric composition of the beam 20 cannot convert torsion into useful energy, thus the continuous spiral shape, or circular spiral shape, is inefficient.

The solution to the excessive torsion problem is to have the beam turn back on itself, creating multiple shorter beams rather than a single continuous beam. The result is that the deflection manifests as bending rather than twisting, increasing the beam energy conversion efficiency.

Figure 3:
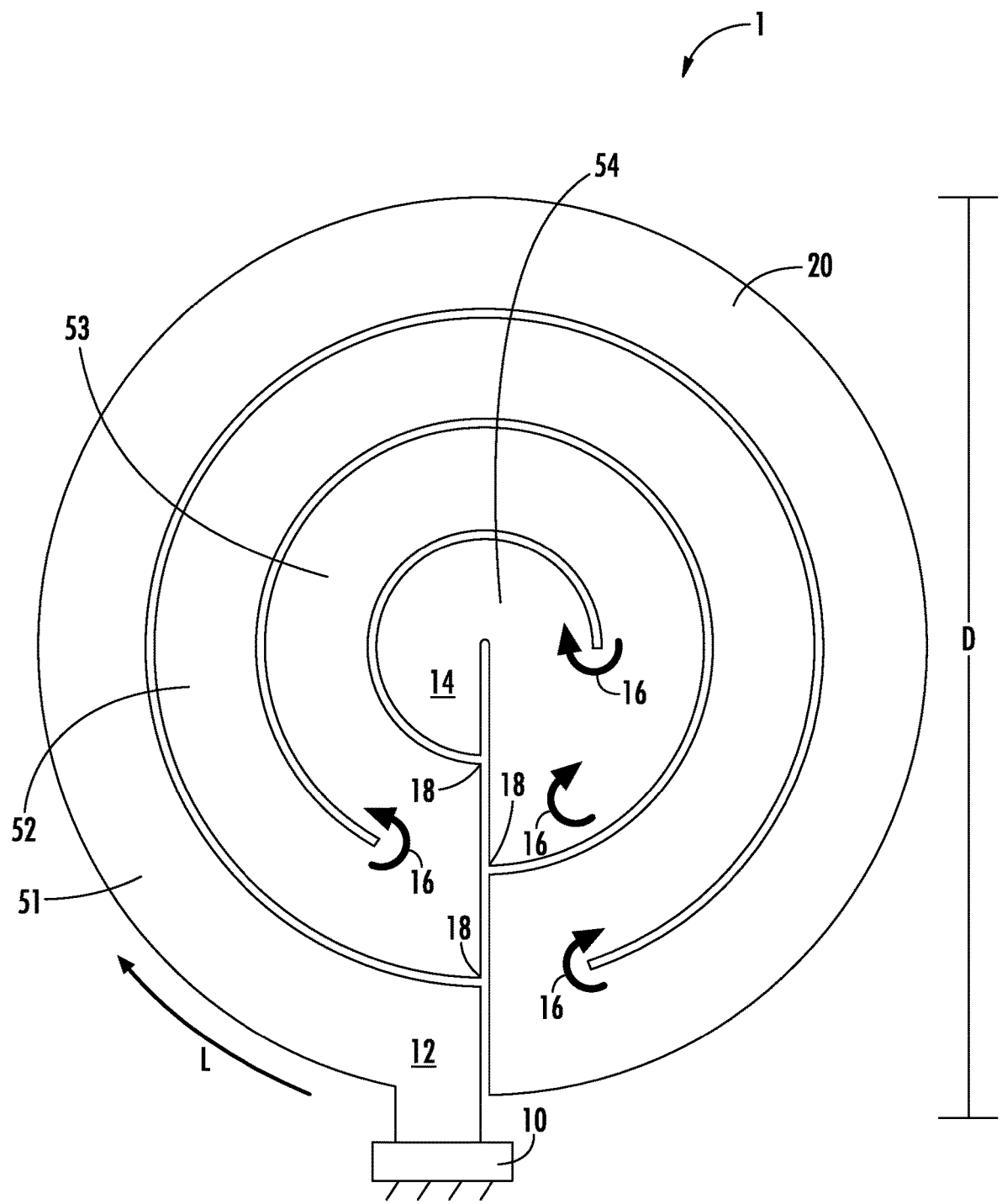
FIG. 3 illustrates a schematic view of a first embodiment.

Referring to FIG. 3, a schematic view of a first embodiment is shown.

The beam 20 has a circular zigzag shape. The segments, or turns, of the beam 20 are curved, taking the form of circles or arcs. But rather than an ever-decreasing diameter, as that of the circular spiral shape in FIG. 2, the turns are of a consistent diameter. At the end of each beam the shape changes direction, or zigzags, at a reversal 16, moving to a larger or smaller diameter, and thus beginning an additional turn or beam segment.

The beam 20 of the energy harvesting cantilever 1 starts at fixed end 12, which is connected to anchor 10. Beam 20 continues along length L, the beam 20 including multiple reversals 16 along its length before reaching free end 14. The result is a beam 20 of an increased length L as compared to a straight beam, while maintaining a diameter D that is a fraction of beam length L.

A reversal 16 is a point at which the beam changes direction by substantially 180 degrees, resulting in a subsequent path that is parallel to the previous portion of the beam 20. The result is a series of nested parallel curves of decreasing diameter until the beam 20 reaches the free end 14.

The reversals 16 in the first embodiment include hard or sharp corners 18. This type of corner maximizes the area of the beam 20, and thus maximizes the area of piezoelectric material available for energy conversion.

The first embodiment shown in FIG. 3 has four turns or bands. Shown are first turn 51, second turn 52, third turn 53, and fourth turn 54.

Embodiments with four or five turns are preferred, but other numbers of turns are anticipated.

Figure 4:
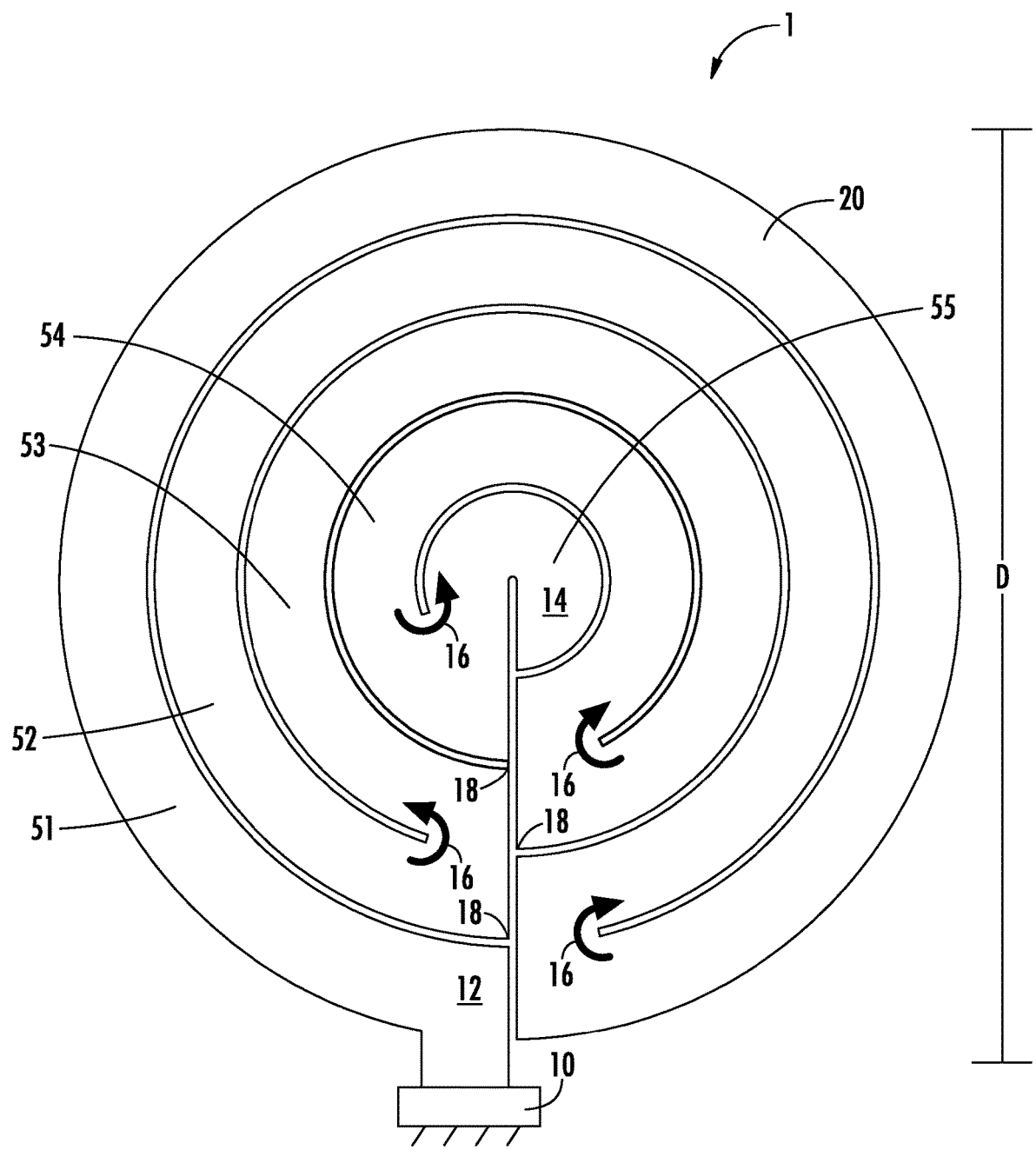
FIG. 4 illustrates a schematic view of a second embodiment.

Referring to FIG. 4, a schematic view of a second embodiment is shown. The second embodiment of the energy harvesting cantilever 1 is similar to the first embodiment, but with the addition of a fifth turn 55.

As described above regarding FIG. 3, FIG. 4 discloses a circular zig zag shape.

The reversals 16 in the second embodiment are also hard or sharp corners 18. This type of corner maximizes the area of the beam 20, and thus maximizes the area of piezoelectric material available for energy conversion.

Figure 5:
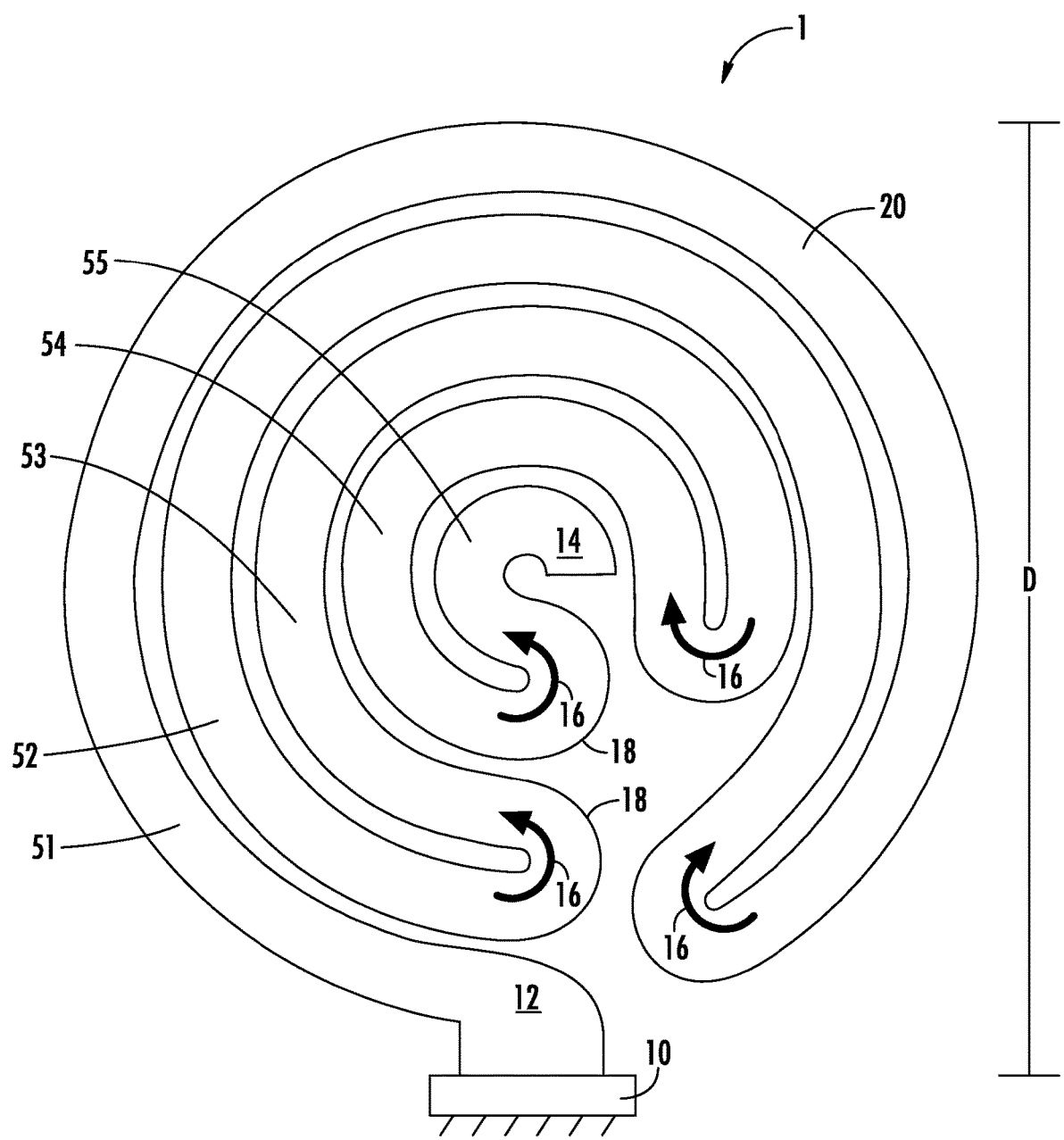
FIG. 5 illustrates a schematic view of a third embodiment.

Referring to FIG. 5, a schematic view of a third embodiment is shown.

The reversals 16 in the third embodiment are soft or rounded corners 18. This type of corner reduces stress concentrations at the reversal 16, but does reduce the area of piezoelectric material available for energy conversion.

Figure 6A:
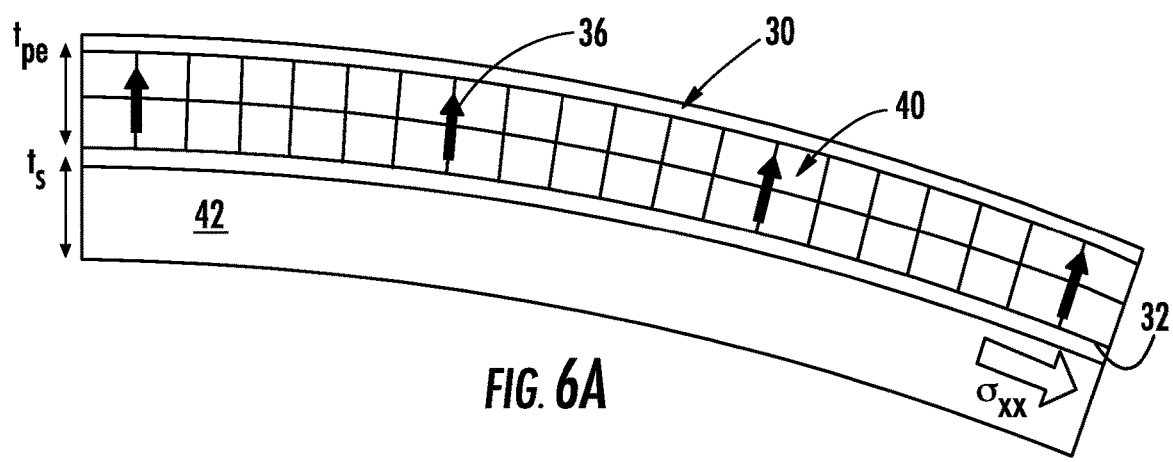
FIG. 6a illustrates a cross-sectional view of a piezoelectric beam of a first type.

Referring to FIG. 6a, a cross-sectional view of a piezoelectric beam of a first type is shown.

The illustrated configuration is referred to as a d31 mode. In this mode, the piezoelectric layer 40 is sandwiched between a positive electrode 30 and a negative electrode 32. The layers are bonded to a layer of silicon or electrically passive substrate 42. Deflection causes current flow 36 in the piezoelectric layer 40 from negative electrode 32 to positive electrode 30.

The thickness of the piezoelectric layer 40 is $t_{pe}$ and the thickness of the silicon 42 is $t_s$.

Figure 6B:
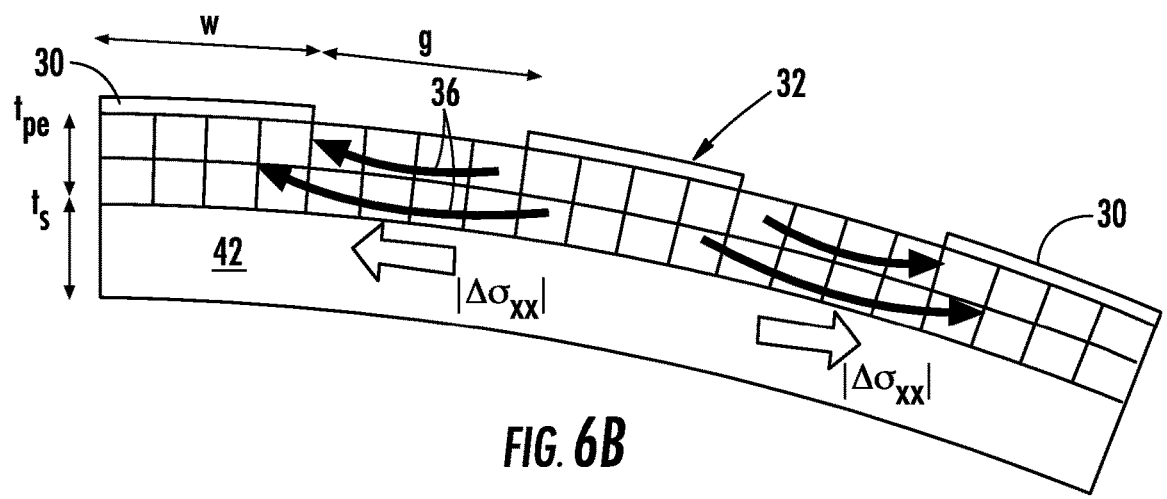
FIG. 6b illustrates a cross-sectional view of a piezoelectric beam of a second type.

Referring to FIG. 6b, a cross-sectional view of a piezoelectric beam of a second type is shown.

The illustrated configuration is referred to as a d33 mode. In this mode, the piezoelectric layer 40 is directly affixed to the layer of silicon or electrically passive substrate 42. Deflection causes current flow 36 in the piezoelectric layer 40 from negative electrode 32 to positive electrode 30, but in this configuration the electrodes 30/32 are both affixed to the same surface of the piezoelectric layer 40. Each of these 'planar' electrodes 30/32 have a width w, and a gap between electrodes of g.

As above, the thickness of the piezoelectric layer 40 is $t_{pe}$ and the thickness of the silicon 42 is $t_s$.

Figure 7A:
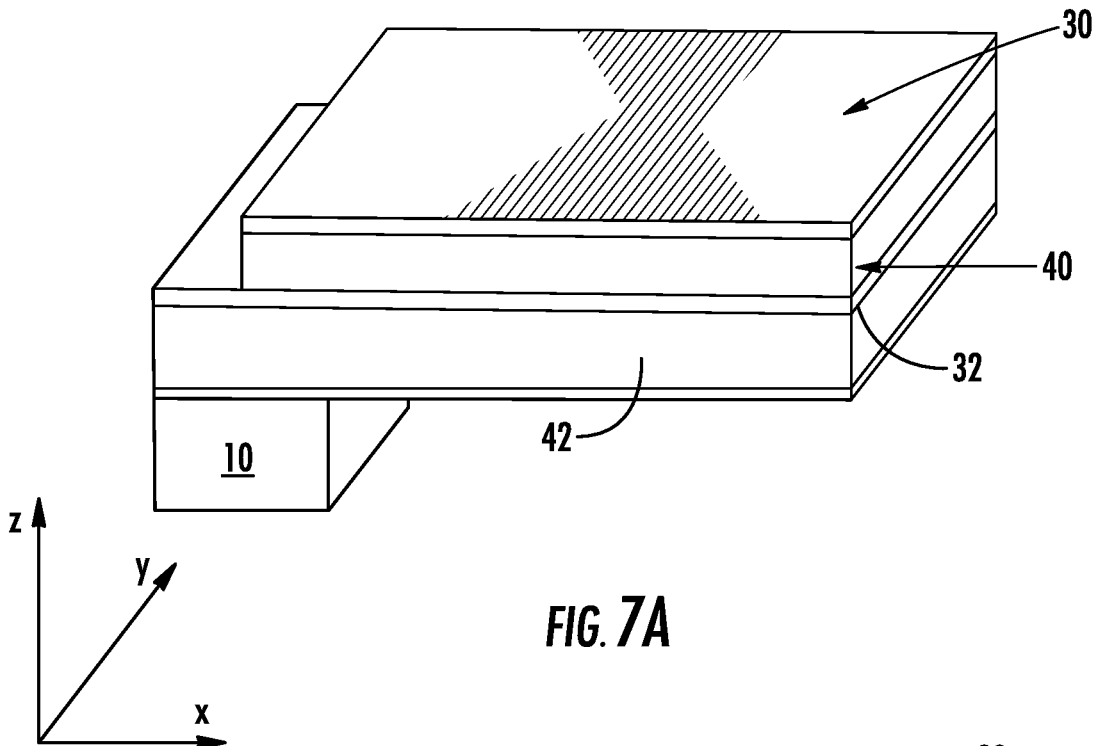
FIG. 7a illustrates an isometric view of a piezoelectric beam of a first type.

Referring to FIG. 7a, an isometric view of a piezoelectric beam of a first type is shown.

The illustrated configuration is referred to as d31 mode. The beam 20 includes a positive electrode 30, negative electrode 32 with piezoelectric layer 40 between. The beam 20 is affixed at anchor 10.

A beam 20 constructed with d31 mode electrodes may be curved without a loss of functionality because the electrodes 30/32 are continuous sheets. Thus, an in-plane curve does not affect the electrode shape.

Figure 7B:
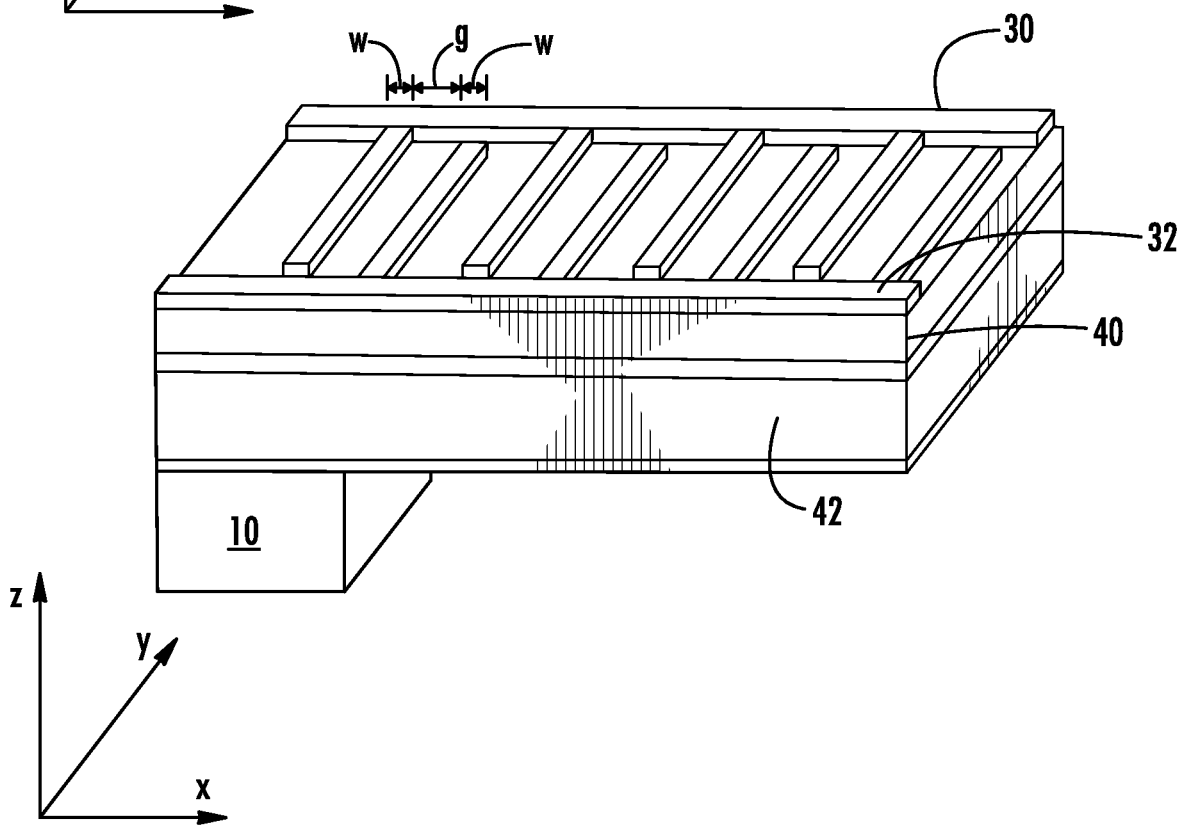
FIG. 7b illustrates an isometric view of a piezoelectric beam of a second type.

Referring to FIG. 7b, an isometric view of a piezoelectric beam of a second type is shown.

The illustrated configuration is referred to as d33 mode. With this isometric view, the positive electrodes 30 and negative electrodes 32 are shown in their interdigitated pattern. An interdigitated pattern is similar to that created by two hands in a single plane, the fingers interlocking with each other without contact. With a straight beam 20, the width w of each electrode and gap g are consistent.

The beam 20 is affixed at anchor 10.

A beam 20 constructed with d33 mode electrodes, when curved, no longer operates efficiently because the electrodes 30/32 are individual protrusions. When curved in-plane, the gaps become inconsistent and affect function.

Figure 8:
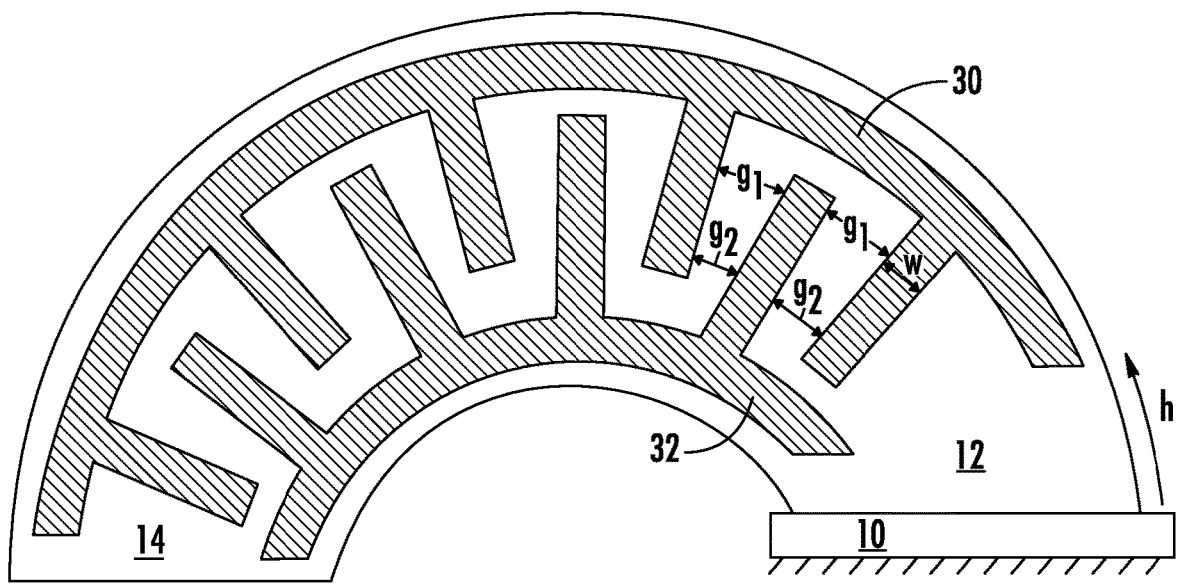
FIG. 8 illustrates a curved beam with a standard electrode pattern.

FIG. 8 illustrates a curved beam with a standard electrode pattern. As shown, the curvature of the beam affects the pattern of the electrodes 30/32. While the electrode width w remains consistent, the gap g does not. Instead, some gaps, such as $g_1$, are greater than other gaps, such as $g_2$. The result is inconsistent voltage generation, non-uniform poling of the piezoelectric between the electrodes and potential for electrical shorting and piezoelectric breakdown across the narrower gaps.

Figure 9:
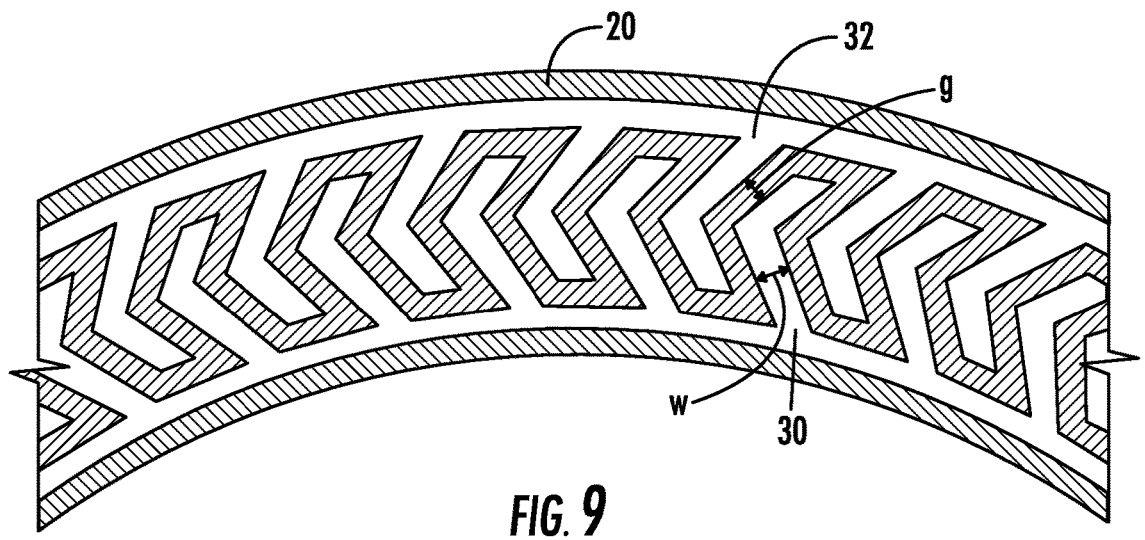
FIG. 9 illustrates a schematic view of a chevron electrode pattern.

Referring to FIG. 9, a schematic view of a chevron electrode pattern is shown.

The chevron electrode pattern bends each electrode 30/32, or the finger-shaped protrusions of each electrode 30/32, across the centerline of the beam 20, resulting in consistent gaps g and electrode widths 2.

Figure 10:
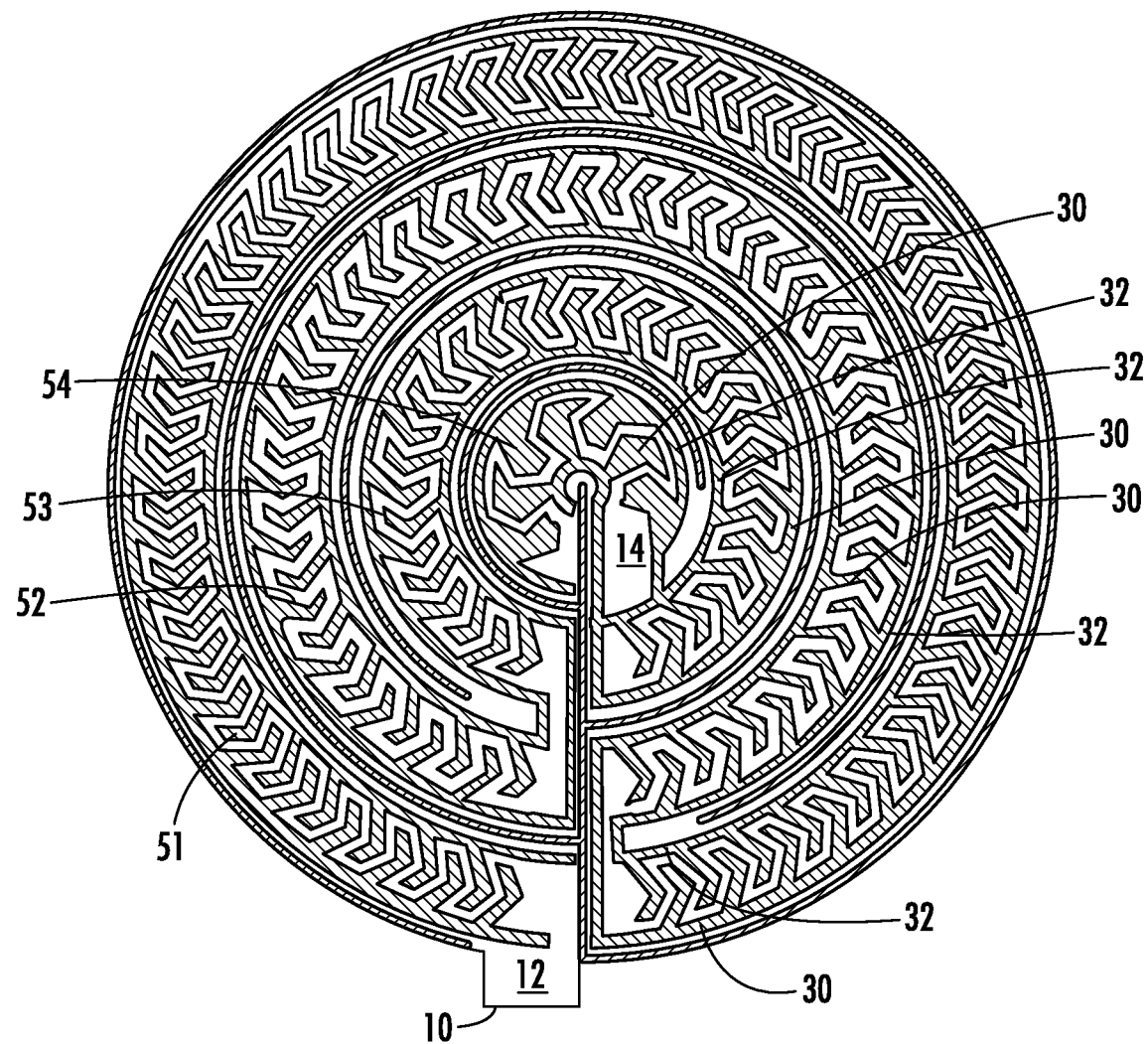
FIG. 10 illustrates a schematic view of the first embodiment with a chevron electrode pattern.

Referring to FIG. 10, a schematic view of the first embodiment with a chevron electrode pattern is shown.

The first embodiment of the energy harvesting cantilever 1 with chevron electrode pattern is shown, this embodiment including first turn 51, second turn 52, third turn 53, and fourth turn 54.

Also visible are the chevron-shaped electrodes associated with each turn. Specifically, positive electrode 30 and negative electrode 32. The connections between the electrodes 30/32 of each turn are also shown.

The electrodes 30/32 may be linked to each other in succession, forming a daisy chain arrangement leading to the outermost turn, here the first turn 51. Or the electrodes 30/32 of each turn 51/52/53/54 may be individually connected to the external power measurement device.

Figure 11:
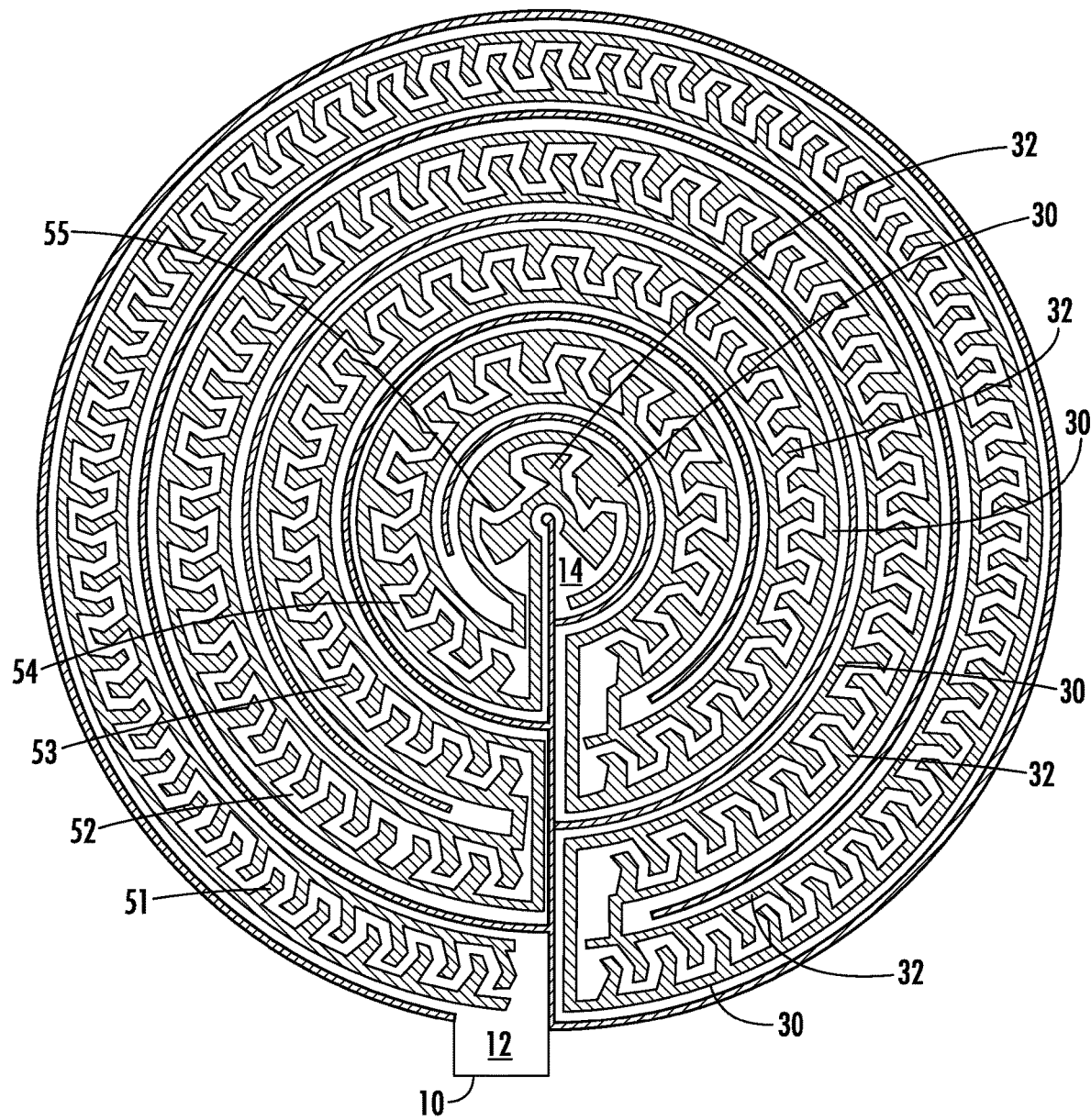
FIG. 11 illustrates a schematic view of the second embodiment with a chevron electrode pattern.

Referring to FIG. 11, a schematic view of the second embodiment with a chevron electrode pattern is shown.

The second embodiment of the energy harvesting cantilever 1 with chevron electrode pattern is shown, this embodiment including first turn 51, second turn 52, third turn 53, fourth turn 54, and fifth turn 55.

Also visible are the chevron-shaped electrodes associated with each turn. Specifically, positive electrode 30 and negative electrode 32. The connections between the electrodes 30/32 of each turn are also shown.

As above, the electrodes 30/32 may be linked to each other in succession, forming a daisy chain arrangement leading to the outermost turn, here the first turn 51. Or the electrodes 30/32 of each turn 51/52/53/55 may be individually connected to the external power measurement device.

Equivalent elements can be substituted for the ones set forth above such that they perform in substantially the same manner in substantially the same way for achieving substantially the same result.

It is believed that the system and method as described and many of its attendant advantages will be understood by the foregoing description.

It is also believed that it will be apparent that various changes may be made in the form, construction, and arrangement of the components thereof without departing from the scope and spirit of the invention or without sacrificing all of its material advantages. The form herein before described being merely exemplary and explanatory embodiment thereof.

What is claimed is:

1. A micro-scale energy harvester to capture vibrational energy, the harvester comprising:
   a. a beam;
      i. the beam having a substantially planar shape;
      ii. the beam having a first end and a second end;
         1. the first end acting as a fixed end, about which the beam oscillates;
         2. the second end acting a free end;
      iii. the beam formed from at least a first layer;
         1. the first layer comprised of piezoelectric material;
      iv. the beam formed from at least a first turn and a second turn;
      v. wherein the first turn and the second turn are curved sections of the beam, connected at their respective ends;
   b. a first electrode and a second electrode formed from a multiplicity of finger-shaped protrusions;
      i. the first electrode in contact with the piezoelectric material;
      ii. the second electrode in contact with the piezoelectric material;
      iii. the multiplicity of finger-shaped protrusions forming a chevron pattern by bending across a centerline of the beam;
      iv. the chevron pattern resulting in a consistent gap between any two adjacent finger-shaped protrusions of the multiplicity of finger-shaped protrusions;
      v. thereby preventing arcing between adjacent finger-shaped protrusions of the first and second electrodes.

2. The harvester of claim 1, further comprising:
   the first electrode in contact with the piezoelectric material; and
   the second electrode in contact with the piezoelectric material;
      the first electrode and second electrode configured in d31 mode wherein the piezoelectric layer is sandwiched between the first electrode and second electrode;
   whereby deflection of the beam causes current flow from the first electrode to the second electrode.

3. The harvester of claim 1, further comprising:
   the first electrode in contact with the piezoelectric material; and
   the second electrode in contact with the piezoelectric material;
      the first electrode and second electrode configured in d33 mode wherein the first electrode and second electrode form an interdigitated pattern on a single side of the piezoelectric layer;
   whereby deflection of the beam causes current flow from the first electrode to the second electrode.

4. The harvester of claim 1, further comprising:
   a third turn connected to the second turn; and
   a fourth turn connected to the third turn.

5. The harvester of claim 4, further comprising:
   a fifth turn connected to the fourth turn.

6. The harvester of claim 1, further comprising:
   a second layer comprised of silicon material;
   the second layer parallel to the first layer; and
   the second layer bonded to the first layer.

7. A vibration-sensing device formed from at least one layer of piezoelectric material, the beam having a circular zigzag shape, the device comprising:
   a beam formed from a first turn having first diameter, a second turn having a second diameter, and a third turn having a third diameter;
   each turn having a constant diameter;
   the diameter of the third turn less than the second diameter, the second diameter less than the first diameter;
   the third turn joined to the second turn, the second turn joined to the third turn;
   the beam being substantially planar;
   whereby deformation of the beam in a direction perpendicular to the plane causes deformation of the beam, thereby generating electricity.

8. The device of claim 7, further comprising:
   a first electrode in contact with the at least one layer of piezoelectric material;
   a second electrode in contact with the at least one layer of piezoelectric material; and
   the first electrode and second electrode configured in d31 mode wherein the at least one layer of piezoelectric layer is sandwiched between the first electrode and second electrode;
   whereby deflection of the beam causes current flow from the first electrode to the second electrode.

9. The device of claim 7, further comprising:
   a first electrode in contact with the at least one layer of piezoelectric material;

a second electrode in contact with the at least one layer of piezoelectric material; and the first electrode and second electrode configured in d33 mode wherein the first electrode and second electrode form an interdigitated pattern within a single layer;

whereby deflection of the beam causes current flow from the first electrode to the second electrode.

10. The device of claim 7, wherein:

the first electrode and second electrode are formed from a multiplicity of finger-shaped protrusions;

the multiplicity of finger-shaped protrusions forming a chevron pattern by bending across a centerline of the beam;

the chevron pattern resulting in a consistent gap between any two adjacent finger-shaped protrusions of the multiplicity of finger-shaped protrusions;

thereby preventing arcing between adjacent finger-shaped protrusions of the first and second electrodes.

11. The device of claim 7, further comprising:

a fourth turn connected to the third turn;

a fifth turn connected to the fourth turn.

12. The device of claim 7, further comprising:

a second layer comprised of silicon material;

the second layer parallel to the at least one layer of piezoelectric material; and the second layer bonded to the at least one layer of piezoelectric material.

13. A device that converts mechanical energy into electrical energy, the device comprising:

a plurality of curved cantilever beams;

the curved cantilever beams in a nested arrangement;

the plurality of curved cantilever beams forming a series of parallel curves;

each cantilever beam of the plurality of curved cantilever beams connected to its adjacent cantilever beam at a reversal, each reversal being a point at which the direction of the curve is reversed;

the plurality of curved cantilever beams formed from at least a first layer of piezoelectric material;

whereby deformation of the device correspondingly deforms the piezoelectric material, causing the generation of electricity.

14. The device of claim 13, further comprising:

a first electrode in contact with the first layer of piezoelectric material;

a second electrode in contact with the first layer of piezoelectric material; and the first electrode and second electrode configured in d31 mode wherein the first layer of piezoelectric layer is sandwiched between the first electrode and second electrode;

whereby deflection of the beam causes current flow from the first electrode to the second electrode.

15. The device of claim 13, further comprising:

a first electrode in contact with the first layer of piezoelectric material;

a second electrode in contact with the first layer of piezoelectric material; and the first electrode and second electrode configured in d33 mode wherein the first electrode and second electrode form an interdigitated pattern on a single side of the first layer of piezoelectric layer;

whereby deflection of the beam causes current flow from the first electrode to the second electrode.

16. The device of claim 15, wherein:

the first electrode and second electrode are formed from a multiplicity of finger-shaped protrusions;

the multiplicity of finger-shaped protrusions forming a chevron pattern by bending across a centerline of the beam;

the chevron pattern resulting in a consistent gap between any two adjacent finger-shaped protrusions of the multiplicity of finger-shaped protrusions;

thereby preventing arcing between adjacent finger-shaped protrusions of the first and second electrodes.

17. The device of claim 13, wherein the plurality of curved cantilever beams is four cantilever beams.

18. The device of claim 13, wherein the plurality of curved cantilever beams is five cantilever beams.

19. The device of claim 13, further comprising:

a second layer comprised of silicon material;

the second layer parallel to the first layer; and the second layer bonded to the first layer.

* * * * *